United States Patent
Kim

(10) Patent No.: US 12,489,444 B2
(45) Date of Patent: Dec. 2, 2025

(54) RECEIVER CIRCUIT INCLUDING DIFFERENTIAL BUFFER

(71) Applicant: SK hynix Inc., Gyeonggi-do (KR)

(72) Inventor: Dae Joon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 38 days.

(21) Appl. No.: 18/739,323

(22) Filed: Jun. 11, 2024

(65) Prior Publication Data

US 2025/0293687 A1    Sep. 18, 2025

(30) Foreign Application Priority Data

Mar. 15, 2024  (KR) .................. 10-2024-0036141

(51) Int. Cl.
*H03K 17/687* (2006.01)
*H03K 19/20* (2006.01)

(52) U.S. Cl.
CPC .......... *H03K 17/6872* (2013.01); *H03K 19/20* (2013.01)

(58) Field of Classification Search
CPC ............................ H03K 17/6872; H03K 19/20
USPC ..................................................... 327/581
See application file for complete search history.

(56) References Cited

U.S. PATENT DOCUMENTS

| | | | | |
|---|---|---|---|---|
| 6,615,301 B1* | 9/2003 | Lee | .................. | H04L 25/029 327/170 |
| 8,063,663 B2* | 11/2011 | Mizutani | .............. | H04L 25/0272 326/82 |
| 11,831,283 B2* | 11/2023 | Nimran | .............. | H03F 3/45475 |
| 2007/0085562 A1* | 4/2007 | Nguyen | .............. | H04L 25/0298 326/30 |
| 2007/0285120 A1* | 12/2007 | Venditti | .......... | H03K 19/018557 326/30 |
| 2008/0273603 A1* | 11/2008 | Mizutani | .............. | H04L 25/0292 375/257 |
| 2010/0277220 A1* | 11/2010 | Stoerk | ................. | H03K 19/0019 327/437 |
| 2025/0023529 A1* | 1/2025 | Kim | .................... | H03F 3/45179 |

FOREIGN PATENT DOCUMENTS

| | | |
|---|---|---|
| KR | 10-0436033 B1 | 7/2004 |
| KR | 10-2017-0056952 A | 5/2017 |

* cited by examiner

*Primary Examiner* — Ryan Jager
(74) *Attorney, Agent, or Firm* — IP & T GROUP LLP

(57) ABSTRACT

A receiver circuit may include a differential buffer configured to receive a signal through a first terminal and a signal through a second terminal, and output a first signal and a second signal which is a complementary signal of the first signal; a control circuit configured to generate a pass enable signal in response to the first signal and the second signal; and a pass circuit configured to output the first signal and the second signal as a first reception signal and a second reception signal, respectively, when the pass enable signal is activated, and fix logic levels of the first reception signal and the second reception signal when the pass enable signal is deactivated.

14 Claims, 7 Drawing Sheets

RECEIVER CIRCUIT INCLUDING DIFFERENTIAL BUFFER

CROSS-REFERENCE TO RELATED APPLICATION

This application claims priority under 35 U.S.C. § 119A to Korean Patent Application No. 10-2024-0036141 filed on Mar. 15, 2024, which is incorporated herein by reference in its entirety.

BACKGROUND

1. Technical Field

Embodiments of the present disclosure relate to an integrated circuit technology, and more particularly, to a receiver circuit that receives signals.

2. Related Art

Electronic devices may include many electronic components, and among the electronic devices, a computer system may include a large number of integrated circuit chips. The integrated circuit chips included in the computer system may communicate with each other by transmitting and receiving clocks and data. As the operating speed of the computer system increases, the operating speeds of the integrated circuit chips are also increasing, and in order to stably transmit/receive signals at a high speed, important signals such as clocks are transmitted/received using a differential method.

SUMMARY

In an embodiment of the present disclosure, a receiver circuit may include a differential buffer configured to receive a signal through a first terminal and a signal through a second terminal, and output a first signal and a second signal which is a complementary signal of the first; a control circuit configured to generate a pass enable signal in response to the first signal and the second signal; and a pass circuit configured to output the first signal and the second signal as a first reception signal and a second reception signal, respectively, when the pass enable signal is activated, and fix logic levels of the first reception signal and the second reception signal when the pass enable signal is deactivated.

In an embodiment of the present disclosure, a receiver circuit may include a differential buffer configured to be enabled in response to a buffer enable signal, receive a signal through a first terminal and a signal through a second terminal, and output a first signal and a second signal which is a complementary signal of the first signal; a delay circuit configured to generate a control enable signal by delaying the buffer enable signal; a control circuit configured to generate a pass enable signal in response to the control enable signal, the first signal, and the second signal; and a pass circuit configured to output the first signal and the second signal as a first reception signal and a second reception signal, respectively, when the pass enable signal is activated, and fix logic levels of the first reception signal and the second reception signal when the pass enable signal is deactivated.

DETAILED DESCRIPTION

Various embodiments of the present disclosure are directed to providing a receiver circuit capable of stably receiving signals.

In accordance with embodiments of the present disclosure, a receiver circuit may receive signals more stably.

Hereafter, embodiments in accordance with the technical spirit of the present disclosure will be described with reference to the accompanying drawings.

Figure 1:
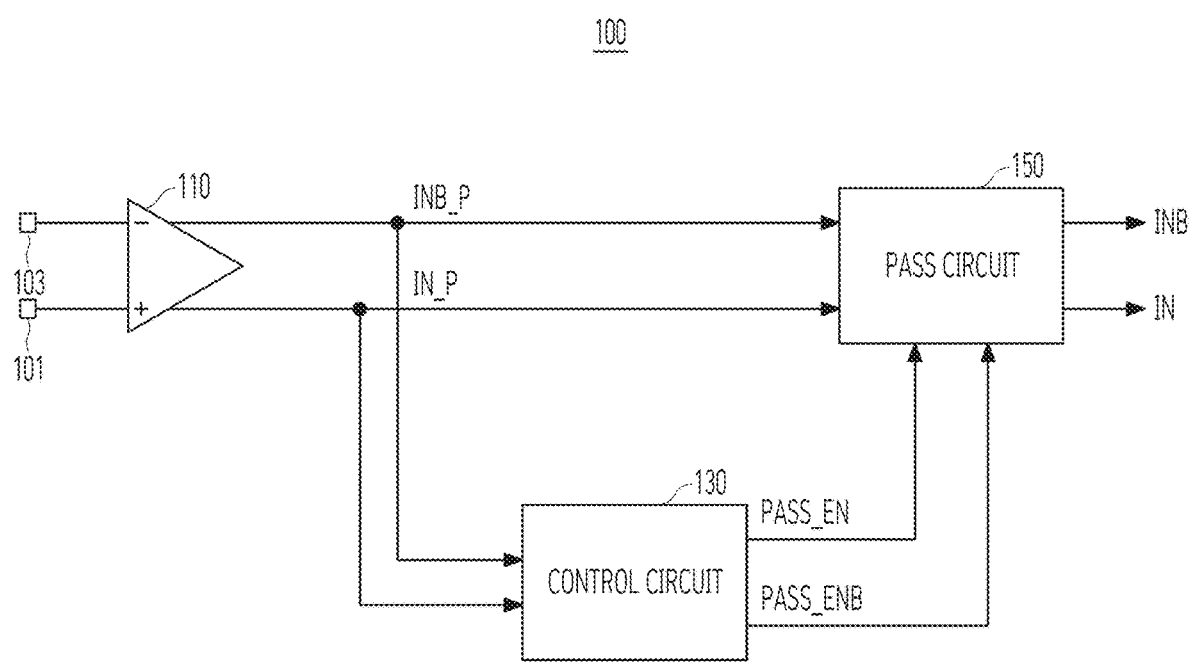
FIG. 1 is a diagram illustrating a configuration of a receiver circuit in accordance with an embodiment of the present disclosure.

FIG. 1 is a diagram illustrating a configuration of a receiver circuit 100 in accordance with an embodiment of the present disclosure.

Referring to FIG. 1, the receiver circuit 100 may include a differential buffer 110, a control circuit 130, and a pass circuit 150.

The differential buffer 110 may receive a signal through a first terminal 101 and a signal through a second terminal 103, and output a first signal IN_P and a second signal INB_P which is a complementary signal (i.e., bar signal) of first signal IN_P. The differential buffer 110 may compare a voltage level of the signal received through the first terminal 101 and a voltage level of the signal received through the second terminal 103, and output the first signal IN_P at a logic high level and the second signal INB_P at a logic low level when the voltage level of the signal received through the first terminal 101 is higher than the voltage level of the signal received through the second terminal 103. On the other hand, when the voltage level of the signal received through the second terminal 103 is higher than the voltage level of the signal received through the first terminal 101, the differential buffer 110 may output the second signal INB_P at a logic high level and the first signal IN_P at a logic low level. Differential signals may be applied to the first terminal 101 and the second terminal 103. For example, when a clock is applied to the first terminal 101, an inverted clock (i.e., complementary clock or bar clock) having an opposite phase to a phase of the clock applied to the first terminal 101 may be applied to the second terminal 103.

The control circuit 130 may generate a pass enable signal PASS_EN in response to the first signal IN_P and the second signal INB_P. The control circuit 130 may activate the pass enable signal PASS_EN when the first signal IN_P and the second signal INB_P have different levels, and deactivate the pass enable signal PASS_EN when the first signal IN_P and the deactivate signal INB_P have the same level. An inverted pass enable signal PASS_ENB may be an inverted signal of the pass enable signal PASS_EN.

Because signals input to the first terminal 101 and the second terminal 103 are differential signals, it is normal that the first signal IN_P and the second signal INB_P received by the differential buffer 110 have different levels. However, in special situations such as when the first terminal 101 and the second terminal 103 are in a Hi-Z state or when power supplied to the differential buffer 110 is abnormal, the first signal IN_P and the second signal INB_P may have the same level. Because the first signal IN_P and the second signal INB_P are also differential signals, the first signal IN_P and the second signal INB_P need to have opposite phases, and when the first signal IN_P and the second signal INB_P having the same level are transmitted to circuits (for example, circuits such as flip-flops) behind the receiver circuit 100, the circuits may enter an abnormal and unstable state such as metastable. That is, when the differential signals have the same level rather than different levels, operations of circuits operating using the differential signals may become unstable. When the pass enable signal PASS_EN is activated as a signal for preventing this problem, that is, when the first signal IN_P and the second signal INB_P have different levels, the first signal IN_P and the second signal INB_P are transmitted to the circuits behind the receiver circuit 100. However, when the pass enable signal PASS_EN is deactivated, that is, when the first signal IN_P and the second signal INB_P have the same level, the pass enable signal PASS_EN may be a signal for preventing the first signal IN_P and the second signal INB_P from being transmitted to the circuits behind the receiver circuit 100 as they are.

The pass circuit 150 may output the first signal IN_P and the second signal INB_P as a first reception signal IN and a second reception signal INB, respectively, when the pass enable signal PASS_EN is activated, and fix the logic levels of the first reception signal IN and the second reception signal INB to different levels when the pass enable signal PASS_EN is deactivated.

Figure 2:
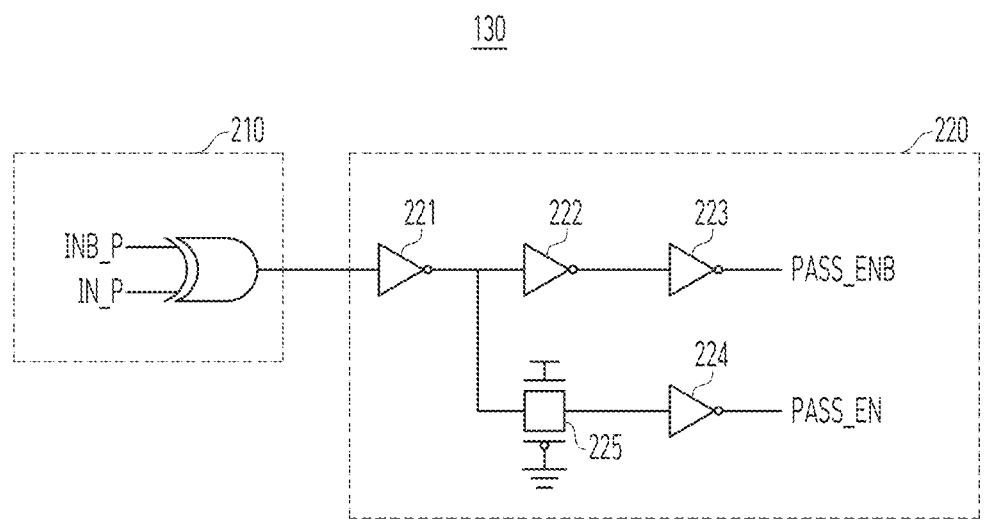
FIG. 2 is a diagram illustrating a detailed configuration of a control circuit in FIG. 1, in accordance with an embodiment of the present disclosure.

FIG. 2 is a diagram illustrating a detailed configuration of the control circuit 130 in FIG. 1, in accordance with an embodiment of the present disclosure.

Referring to FIG. 2, the control circuit 130 may include an identity determination unit (i.e., identity determination circuit) 210 and a signal generation unit (i.e., signal generation circuit) 220.

The identity determination unit 210 may determine whether the first signal IN_P and the second signal INB_P have the same level or different levels. The identity determination unit 210 may include an XOR gate. When the first signal IN_P and the second signal INB_P have different levels, the output of the identity determination unit 210 may have a logic high level, and when the first signal IN_P and the second signal INB_P have the same level, the output of the identity determination unit 210 may have a logic low level.

When the first signal IN_P and the second signal INB_P have different levels as the determination result of the identity determination unit 210, the signal generation unit 220 may activate the pass enable signal PASS_EN to a logic high level and enable the inverted pass enable signal PASS_ENB to a logic low level. When the first signal IN_P and the second signal INB_P have the same level as the determination result of the identity determination unit 210, the signal generation unit 220 may deactivate the pass enable signal PASS_EN to a logic low level and deactivate the inverted pass enable signal PASS_ENB to a logic high level.

The signal generation unit 220 may include inverters 221 to 224 and a pass gate (i.e., transmission gate) 225. An output signal of the identity determination unit 210 may be the pass enable signal PASS_EN by passing through the two inverters 221 and 225 and the pass gate 224. The output signal of the identity determination unit 210 may be the inverted pass enable signal PASS_ENB by passing through the three inverters 221 to 223. That is, the pass enable signal PASS_EN may have the same logic level as the logic level of the output signal of the identity determination unit 210, and the inverted pass enable signal PASS_ENB may have a logic level opposite to the logic level of the output signal of the identity determination unit 210.

The pass gate 225 may include a PMOS transistor and an NMOS transistor connected in parallel. Because a ground voltage is applied to a gate of the PMOS transistor and a power supply voltage is applied to a gate of the NMOS transistor, the pass gate 225 may always maintain a turn-on state. The pass gate 225 may be used to match a delay value of the path enable signal PASS_EN with a delay value of the inverted path enable signal PASS_ENB.

Figure 3:
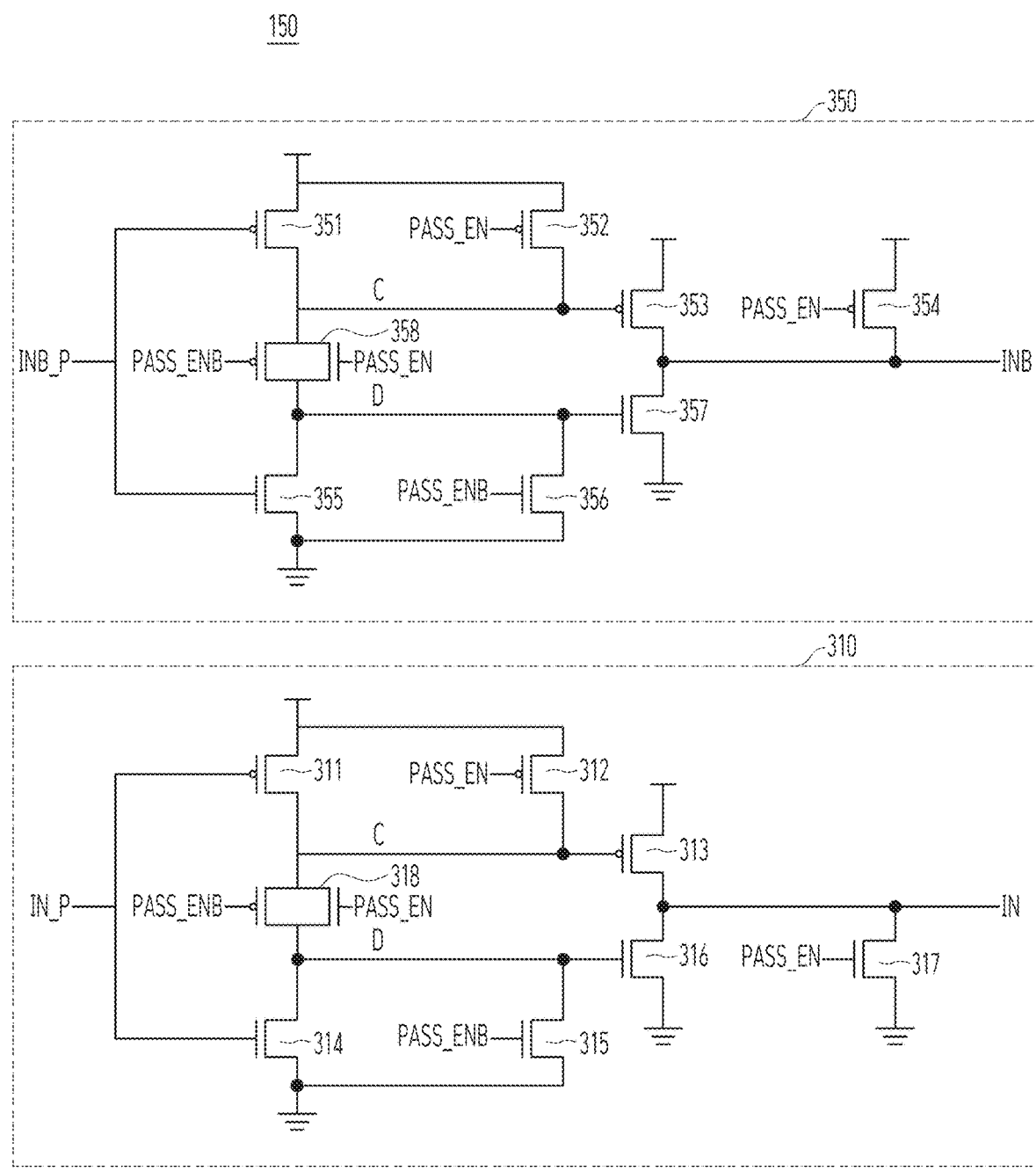
FIG. 3 is a diagram illustrating a detailed configuration of a pass circuit in FIG. 1, in accordance with an embodiment of the present disclosure.

FIG. 3 is a diagram illustrating a detailed configuration of the pass circuit 150 in FIG. 1, in accordance with an embodiment of the present disclosure.

Referring to FIG. 3, the pass circuit 150 may include a first pass unit (i.e., first pass circuit) 310 and a second pass unit (i.e., second pass circuit) 350.

The first pass unit 310 may transmit the first signal IN_P as the first reception signal IN. When the pass enable signal PASS_EN is activated to a logic high level, the first pass unit 310 may output the first signal IN_P as the first reception signal IN as is. However, when the pass enable signal PASS_EN is deactivated to a logic low level, the first pass unit 310 may fix the level of the first reception signal IN to a logic low level regardless of the level of the first signal IN_P.

The first pass unit 310 may include a PMOS transistor 311 that pulls up a node A in response to the first signal IN_P, a PMOS transistor 312 that pulls up the node A in response to the pass enable signal PASS_EN being deactivated to a logic low level, a PMOS transistor 313 that pulls up the first reception signal IN in response to a signal of the node A, an NMOS transistor 314 that pulls down a node B in response to the first signal IN_P, an NMOS transistor 315 that pulls down the node B in response to the pass enable signal PASS_EN being deactivated to a logic low level (that is, in response to the inverted pass enable signal being deactivated to a logic high level), an NMOS transistor 316 that pulls down the first reception signal IN in response to a signal of the node B, an NMOS transistor 317 that pulls down the first reception signal IN in response to the pass enable signal PASS_EN being deactivated to a logic low level (that is, in response to the inverted pass enable signal PASS_ENB being deactivated to a logic high level), and an equalization unit (i.e., equalization circuit) 318 that electrically connects the nodes A and B in response to the pass enable signal PASS_EN being activated to a logic high level and the inverted pass enable signal PASS_ENB being deactivated to a logic low level.

When the pass enable signal PASS_EN is deactivated to a logic low level and the inverted pass enable signal PASS_ENB is deactivated to a logic high level, the equalization unit 318 of the first pass unit 310 may be turned off, the PMOS transistor 312 may be turned on, the PMOS transistor 313 may be turned off, the NMOS transistor 315 may be turned on, the NMOS transistor 316 may be turned off, and the NMOS transistor 317 may be turned on. As a result, the level of the first signal IN_P may be fixed to a logic low level by the turned-on NMOS transistor 317.

When the pass enable signal PASS_EN is activated to a logic high level and the inverted pass enable signal PASS_ENB is activated to a logic low level, the equalization unit 318 of the first pass unit 310 may be turned on to allow electrical connection between the nodes A and B, the PMOS transistor 312 may be turned off, and the NMOS transistors 315 and 317 may be turned off. As a result, the PMOS transistor 311 and the NMOS transistor 314 may operate as an inverter to invert and output the first signal IN_P, and the PMOS transistor 313 and the NMOS transistor 316 may operate as an inverter to invert the inverted signal IN_P again and output the inverted signal IN_P as the first reception signal IN. That is, when the pass enable signal PASS_EN is activated, the first reception signal IN may have the same logic level as the first signal IN_P.

The second pass unit 350 may transmit the second signal INB_P as the second reception signal INB. When the pass enable signal PASS_EN is activated to a logic high level, the second pass unit 350 may output the second signal INB_P as the second reception signal INB as is. However, when the pass enable signal PASS_EN is deactivated to a logic low level, the second pass unit 350 may fix the level of the second reception signal INB to a logic high level regardless of the level of the second signal INB_P.

That is, it can be seen that the first pass unit 310 includes the two inverters 311 and 314 connected in series and the two inverters 313 and 316 connected in series in order to output the first signal IN_P as the first reception signal IN, and off control units (i.e., off control circuits) 318, 312, 315, and 317 for controlling the turn-off of the inverters 311, 314, 313, and 316 to disable the inverters 313 and 316 when the pass enable signal PASS_EN is deactivated, and fix the level of the first reception signal IN being an output signal of the inverters 313 and 316.

The second pass unit 350 may include a PMOS transistor 351 that pulls up a node C in response to the second signal INB_P, a PMOS transistor 352 that pulls up the node C in response to the pass enable signal PASS_EN being deactivated to a logic low level, a PMOS transistor 353 that pulls up the second reception signal INB in response to a signal of the node C, a PMOS transistor 354 that pulls up the second reception signal INB in response to the pass enable signal PASS_EN being deactivated to a logic low level (that is, in response to the inverted pass enable signal PASS_ENB being deactivated to a logic high level), an NMOS transistor 355 that pulls down a node D in response to the second signal INB_P, an NMOS transistor 356 that pulls down the node D in response to the pass enable signal PASS_EN being deactivated to a logic low level (that is, in response to the inverted pass enable signal PASS_ENB being deactivated to a logic high level), an NMOS transistor 357 that pulls down the second reception signal INB in response to a signal of the node D, and an equalization unit (i.e., equalization circuit) 358 that electrically connects the nodes C and D in response to the pass enable signal PASS_EN being activated to a logic high level and the inverted pass enable signal PASS_ENB being activated to a logic low level.

When the pass enable signal PASS_EN is deactivated to a logic low level and the inverted pass enable signal PASS_ENB is deactivated to a logic high level, the equalization unit 358 of the second pass unit 350 may be turned off, and the PMOS transistor 352 may be turned on, the PMOS transistor 353 may be turned off, the NMOS transistor 356 may be turned on, the NMOS transistor 357 may be turned off, and the PMOS transistor 354 may be turned on. As a result, the level of the second signal INB_P may be fixed to a logic high level by the turned-on PMOS transistor 354.

When the pass enable signal PASS_EN is activated to a logic high level and the inverted pass enable signal PASS_ENB is activated to a logic low level, the equalization unit 358 of the second pass unit 350 may be turned on to allow electrical connection between the nodes C and D, the PMOS transistors 352 and 354 may be turned off, and the NMOS transistor 356 may be turned off. As a result, the PMOS transistor 351 and the NMOS transistor 355 may operate as an inverter to invert and output the second signal INB_P, and the PMOS transistor 353 and the NMOS transistor 357 may operate as an inverter to invert the inverted second signal INB_P again and output the inverted second signal INB_P as the second reception signal INB. That is, when the pass enable signal PASS_EN is activated, the second reception signal INB may have the same logic level as the second signal INB_P.

That is, it can be seen that the second pass unit 350 includes the two inverters 351 and 355 connected in series and the two inverters 353 and 357 connected in series in order to output the second signal INB_P as the second reception signal INB, and off control units (i.e., first off control circuit) 358, 352, 356, and 354 for controlling the turn-off of the inverters 351, 355, 353, and 357 to disable the inverters 353 and 357 when the pass enable signal PASS_EN is deactivated, and fix the level of the second reception signal INB being an output signal of the inverters 353 and 357.

Figure 4:
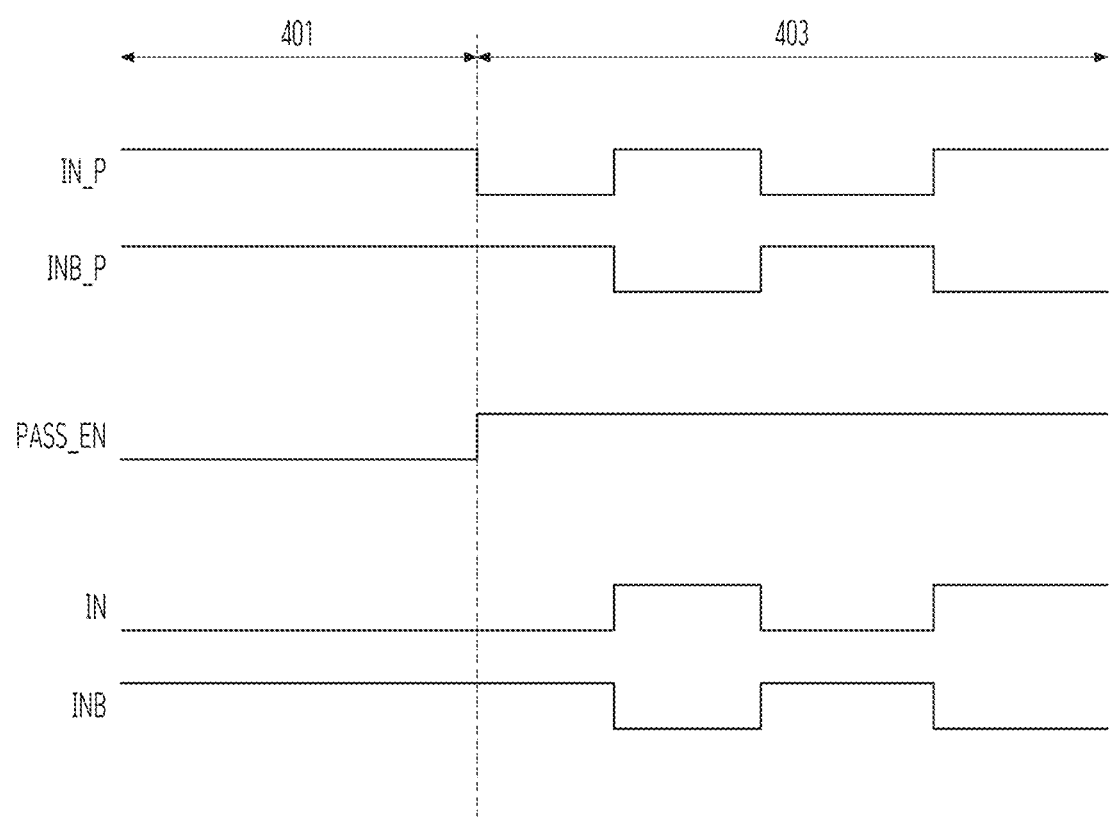
FIG. 4 is a timing diagram for describing an operation of the receiver circuit in FIG. 1, in accordance with an embodiment of the present disclosure.

FIG. 4 is a timing diagram for describing the operation of the receiver circuit 100 in FIG. 1, in accordance with an embodiment of the present disclosure.

Referring to FIG. 4, in a section 401 where the first signal IN_P and the second signal INB_P have the same logic level, the control circuit 130 may deactivate the pass enable signal PASS_EN to a low level. In response to the pass enable signal PASS_EN being deactivated to a low level, the pass circuit 150 may fix the first reception signal IN to a logic low level regardless of the logic levels of the first signal IN_P and the second signal INB_P, and fix the second reception signal INB to a logic high level. Even though the first signal IN_P and the second signal INB_P being the differential signals have the same logic level, the first reception signal IN and the second reception signal INB are fixed to different levels, thereby preventing the operation of circuits behind the receiver circuit 100 from being unstable due to the differential signals having the same logic level.

In a section 403 where the first signal IN_P and the second signal INB_P have different levels, the control circuit 130 may activate the pass enable signal PASS_EN to a high level. The pass circuit 150 may output the first signal IN_P as the first reception signal IN and output the second signal INB_P as the second reception signal INB in a section where the pass enable signal PASS_EN is activated.

Figure 5:
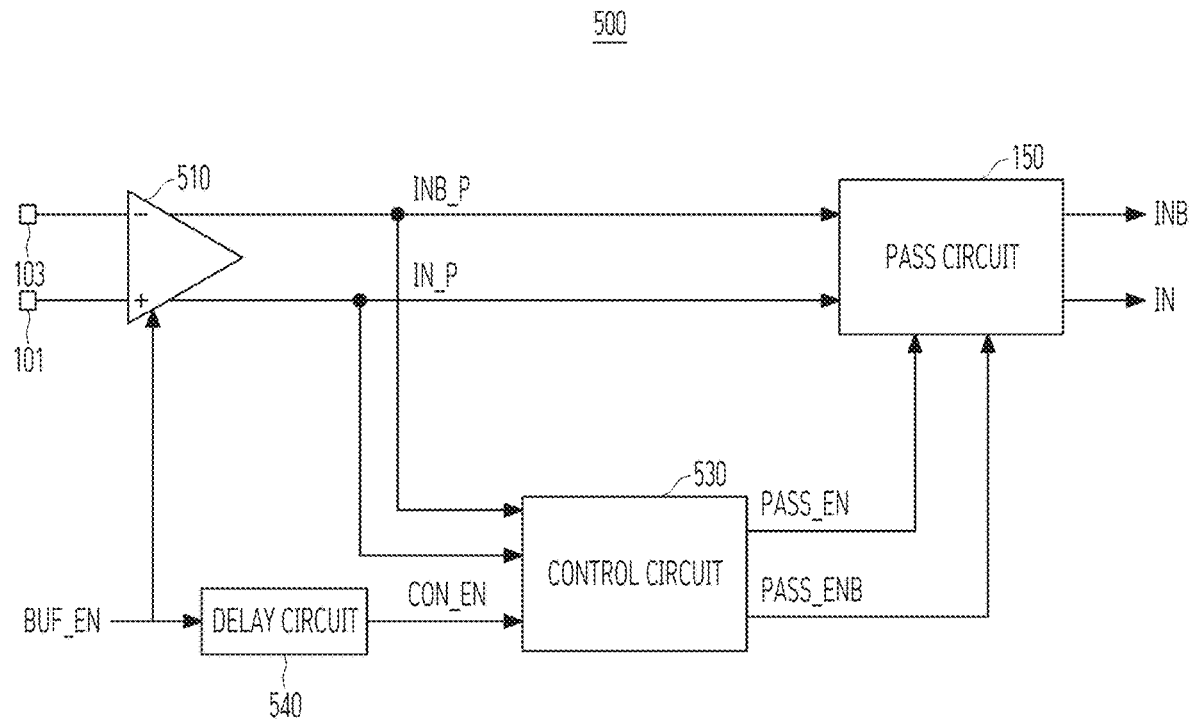
FIG. 5 is a diagram illustrating detailed configuration of a receiver circuit in accordance with another embodiment of the present disclosure.

FIG. 5 is a diagram illustrating a configuration of a receiver circuit 500 in accordance with another embodiment of the present disclosure.

Referring to FIG. 5, the receiver circuit 500 may include a differential buffer 510, a control circuit 530, a pass circuit 150, and a delay circuit 540.

The differential buffer 510 may receive a signal through a first terminal 101 and a signal through a second terminal 103, and output a first signal IN_P and a second signal INB_P which is a complementary signal of the first signal IN_P. The differential buffer 110 may compare the voltage level of the signal received through the first terminal 101 and the voltage level of the signal received through the second terminal 103, and output the first signal IN_P at a logic high level and the second signal INB_P at a logic low level when the voltage level of the signal received through the first terminal 101 is higher than the voltage level of the signal received through the second terminal 103. A buffer enable signal BUF_EN may be a signal for enabling/disabling the differential buffer 510. When the buffer enable signal BUF_EN is activated, the differential buffer 510 is enabled to receive the signals through the terminals 101 and 103, and when the buffer enable signal BUF_EN is deactivated, the differential buffer 510 may be disabled.

The delay circuit 540 may generate a control enable signal CON_EN by delaying the buffer enable signal BUF_EN. After the differential buffer 510 is enabled, a predetermined time is required for the first signal IN_P and the second signal INB_P to be output from the differential buffer 510, and the delay circuit 540 may be used to guarantee this time. The delay circuit 540 may delay the buffer enable signal BUF_EN by using RC delay, inverter delay, or the like.

The control circuit 530 may generate a pass enable signal PASS_EN in response to the first signal IN_P, the second signal INB_P, and the control enable signal CON_EN. When the control enable signal CON_EN is activated and logic levels of the first signal IN_P and the second signal INB_P are different from each other, the control circuit 530 may activate the pass enable signal PASS_EN. When the control enable signal CON_EN is activated and the logic levels of the first signal IN_P and the second signal INB_P are the same, the control circuit 530 may deactivate the pass enable signal PASS_EN. Further, when the control enable signal CON_EN is deactivated, the control circuit 530 may deactivate the pass enable signal PASS_EN. When the control enable signal CON_EN is deactivated, that is, when the differential buffer 510 is disabled and the first signal IN_P and the second signal INB_P are at unstable levels, because the control circuit 530 deactivates the pass enable signal PASS_EN, a first reception signal IN and a second reception signal INB output from the receiver circuit 500 may be fixed to stable levels.

The pass circuit 150 may output the first signal IN_P and the second signal INB_P as the first reception signal IN and the second reception signal INB, respectively, when the pass enable signal PASS_EN is activated, and fix logic levels of the first reception signal IN and the second reception signal INB to different levels when the pass enable signal PASS_EN is deactivated. The pass circuit 150 may be configured as illustrated in FIG. 3 described above.

Figure 6:
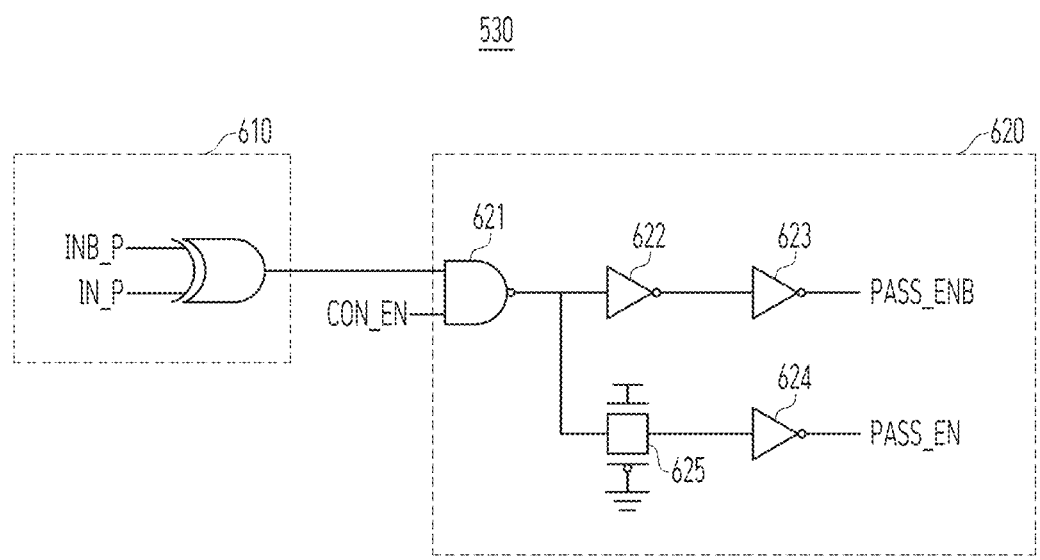
FIG. 6 is a diagram one detailed configuration of a control circuit in FIG. 5, in accordance with an embodiment of the present disclosure.

FIG. 6 is a diagram illustrating one detailed configuration of an embodiment of the control circuit 530 in FIG. 5, in accordance with an embodiment of the present disclosure.

Referring to FIG. 6, the control circuit 530 may include an identity determination unit (i.e., identity determination circuit) 610 and a signal generation unit (i.e., signal generation circuit) 620.

The identity determination unit 610 may determine whether the first signal IN_P and the second signal INB_P have the same level or different levels. The identity determination unit 610 may include an XOR gate. When the first signal IN_P and the second signal INB_P have different levels, the output of the identity determination unit 610 may have a logic high level, and when the first signal IN_P and the second signal INB_P have the same level, the output of the identity determination unit 610 may have a logic low level.

When the output signal of the identity determination unit 610 is at a logic high level and the control enable signal CON_EN is activated to a logic high level, the signal generation unit 620 may activate the pass enable signal PASS_EN to a logic high level and enable an inverted pass enable signal PASS_ENB to a logic low level.

The signal generation unit 620 may include a NAND gate 621, inverters 622 to 624, and a pass gate 625. When the output signal of the identity determination unit 610 is at a logic high level and the control enable signal CON_EN is at a logic high level, because the output of the NAND gate 621 is at a logic low level, the inverted pass enable signal PASS_ENB may be activated to a logic low level and output from the inverter 623 and the pass enable signal PASS_EN may be activated to a logic high level and output from the inverter 624. When one or more of the output signal of the identity determination unit 610 and the control enable signal CON_EN are at a logic low level, because the output of the NAND gate 621 is at a logic high level, the inverted pass enable signal PASS_ENB may be deactivated to a logic high level and output from the inverter 623, and the pass enable signal PASS_EN may be deactivated to a logic low level and output from the inverter 624.

The pass gate 625 may include a PMOS transistor and an NMOS transistor connected in parallel. Because a ground voltage is applied to a gate of the PMOS transistor and a power supply voltage is applied to a gate of the NMOS transistor, the pass gate 625 may always maintain a turned-on state. The pass gate 625 may be used to match a delay value of the path enable signal PASS_EN with a delay value of the inverted path enable signal PASS_ENB.

Figure 7:
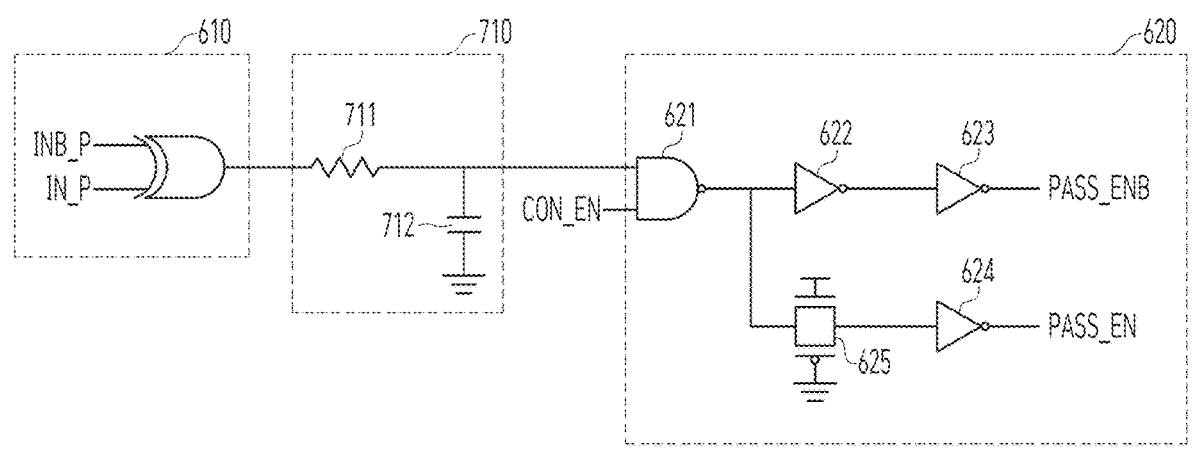
FIG. 7 is a diagram another detailed configuration of the control circuit in FIG. 5, in accordance with an embodiment of the present disclosure.

FIG. 7 is a diagram illustrating another detailed configuration of the control circuit 530 in FIG. 5, in accordance with an embodiment of the present disclosure.

The control circuit 530 in FIG. 7 may further include a low-pass filter 710 compared to the control circuit 530 in FIG. 6.

The low-pass filter 710 may be provided between the output of the identity determination unit 610 and the NAND gate 621 to remove high-frequency noise generated from the output signal of the identity determination unit 610. During the toggling process of the first signal IN_P and the second signal INB_P, the first signal IN_P and the second signal INB_P may have the same logic level for a very short period of time. For example, in a section where the first signal IN_P transitions from a high level to a low level and the second signal INB_P transitions from a low level to a high level, noise, which causes the first signal IN_P and second signal INB_P to be recognized to have the same logic level for a very short period of time, may occur. The low-pass filter 710 may be provided to remove such noise.

The low-pass filter 710 may include a resistor 711 and a capacitor 712, and is also referred to as an RC low-pass filter.

Although embodiments according to the technical idea of the present disclosure have been described above with reference to the accompanying drawings, this is only for describing the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure. Furthermore, the embodiments may be combined to form additional embodiments.

What is claimed is:

1. A receiver circuit comprising:
 a differential buffer configured to receive a signal through a first terminal and a signal through a second terminal, and output a first signal and a second signal which is a complementary signal of the first signal;
 a control circuit configured to generate a pass enable signal in response to the first signal and the second signal; and
 a pass circuit configured to output the first signal and the second signal as a first reception signal and a second reception signal, respectively, when the pass enable signal is activated, and fix logic levels of the first reception signal and the second reception signal when the pass enable signal is deactivated.

2. The receiver circuit of claim 1, wherein the control circuit is configured to deactivate the pass enable signal when logic levels of the first signal and the second signal are equal to each other, and activate the pass enable signal when the logic levels of the first signal and the second signal are different from each other.

3. The receiver circuit of claim 2, wherein, when the pass enable signal is deactivated, the pass circuit is configured to fix the first reception signal and the second reception signal to different logic levels.

4. A receiver circuit comprising:
 a differential buffer configured to be enabled in response to a buffer enable signal, receive a signal through a first terminal and a signal through a second terminal, and output a first signal and a second signal which is a complementary signal of the first signal;
 a delay circuit configured to generate a control enable signal by delaying the buffer enable signal;
 a control circuit configured to generate a pass enable signal in response to the control enable signal, the first signal, and the second signal; and
 a pass circuit configured to output the first signal and the second signal as a first reception signal and a second reception signal, respectively, when the pass enable signal is activated, and fix logic levels of the first reception signal and the second reception signal when the pass enable signal is deactivated.

5. The receiver circuit of claim 4, wherein:
 when the control enable signal is activated and logic levels of the first signal and the second signal are different from each other, the control circuit activates the pass enable signal;
 when the control enable signal is activated and the logic levels of the first signal and the second signal are equal to each other, the control circuit deactivates the pass enable signal; and
 when the control enable signal is deactivated, the control circuit deactivates the pass enable signal.

6. The receiver circuit of claim 5, wherein, when the pass enable signal is deactivated, the pass circuit is configured to fix the first reception signal and the second reception signal to different logic levels.

7. The receiver circuit of claim 5, wherein the control circuit comprises:
 an identity determination circuit configured to determine whether the first signal and the second signal have the same level or different levels; and
 a signal generation circuit configured to generate the pass enable signal in response to a result of the determination of the identity determination circuit and the control enable signal.

8. The receiver circuit of claim 5, wherein the control circuit comprises:
 an identity determination circuit configured to determine whether the first signal and the second signal have the same level or different levels;
 a low-pass filter configured to filter the result of the determination of the identity determination circuit; and
 a signal generation circuit configured to generate the pass enable signal in response to an output of the low-pass filter and the control enable signal.

9. The receiver circuit of claim 6, wherein the pass circuit comprises:
 a first pass circuit configured to transmit the first signal as the first reception signal; and
 a second pass circuit configured to transmit the second signal as the second reception signal.

10. The receiver circuit of claim 9, wherein the second pass circuit comprises:
 a first PMOS transistor configured to pull up a first node in response to the second signal;
 a second PMOS transistor configured to pull up the first node in response to the deactivated pass enable signal;
 a third PMOS transistor configured to pull up the second reception signal in response to a signal of the first node;
 a fourth PMOS transistor configured to pull up the second reception signal in response to the deactivated pass enable signal;
 a first NMOS transistor configured to pull down a second node in response to the second signal;
 a second NMOS transistor configured to pull down the second node in response to the deactivated pass enable signal;
 a third NMOS transistor configured to pull down the second reception signal in response to a signal of the second node; and
 a first equalization circuit configured to electrically connect the first node and the second node in response to the activated pass enable signal.

11. The receiver circuit of claim 10, wherein the first pass circuit comprises:
 a fifth PMOS transistor configured to pull up a third node in response to the first signal;
 a sixth PMOS transistor configured to pull up the third node in response to the deactivated pass enable signal;
 a seventh PMOS transistor configured to pull up the first reception signal in response to a signal of the third node;
 a fourth NMOS transistor configured to pull down a fourth node in response to the first signal;
 a fifth NMOS transistor configured to pull down the fourth node in response to the deactivated pass enable signal;
 a sixth NMOS transistor configured to pull down the first reception signal in response to a signal of the fourth node;
 a seventh NMOS transistor configured to pull down the first reception signal in response to the deactivated pass enable signal; and
 a second equalization circuit configured to electrically connect the third node and the fourth node in response to the activated pass enable signal.

12. The receiver circuit of claim 9, wherein the second pass circuit comprises:
 first and second inverters connected in series to receive the second signal and output the second reception signal; and a first off control circuit configured to disable the second inverter in response to the deactivated pass enable signal, and fix a level of the second reception signal output from the second inverter.

13. The receiver circuit of claim 12, wherein the first pass circuit comprises:
    third and fourth inverters connected in series to receive the first signal and output the first reception signal; and
    a second off control circuit configured to disable the third inverter in response to the deactivated pass enable signal, and fixe a level of the first reception signal output from the third inverter.

14. The receiver circuit of claim 4, wherein a first clock is applied to the first terminal and a second clock having a phase opposite to a phase of the first clock is applied to the second terminal.

* * * * *